US008863060B2

(12) United States Patent
Jagatheesan et al.

(10) Patent No.: US 8,863,060 B2
(45) Date of Patent: Oct. 14, 2014

(54) PROGRAMMABLE INTELLIGENT STORAGE ARCHITECTURE BASED ON APPLICATION AND BUSINESS REQUIREMENTS

(75) Inventors: Arun S. Jagatheesan, Cupertino, CA (US); Zheng Li, Santa Clara, CA (US)

(73) Assignee: Samsung Electronics Co., Ltd., Suwon (KR)

( * ) Notice: Subject to any disclaimer, the term of this patent is extended or adjusted under 35 U.S.C. 154(b) by 121 days.

(21) Appl. No.: 13/550,413

(22) Filed: Jul. 16, 2012

(65) Prior Publication Data

US 2013/0061214 A1    Mar. 7, 2013

Related U.S. Application Data

(60) Provisional application No. 61/532,040, filed on Sep. 7, 2011.

(51) Int. Cl.
*G06F 17/50* (2006.01)
*G06F 9/00* (2006.01)
*G06F 9/455* (2006.01)
*G06F 9/48* (2006.01)
*G06F 9/445* (2006.01)

(52) U.S. Cl.
CPC ........ *G06F 17/5054* (2013.01); *G06F 17/5027* (2013.01); *G06F 9/455* (2013.01); *G06F 9/48* (2013.01); *G06F 9/445* (2013.01)
USPC ........... 716/116; 716/117; 716/121; 716/128; 716/138; 703/16; 713/2; 713/100

(58) Field of Classification Search
CPC ... G06F 17/5054; G06F 17/5027; G06F 9/48; G06F 9/455; G06F 9/445
USPC ............ 716/116, 117, 121, 128, 138; 703/16; 713/2, 100
See application file for complete search history.

(56) References Cited

U.S. PATENT DOCUMENTS

| | | | | |
|---|---|---|---|---|
| 5,787,437 A * | 7/1998 | Potterveld et al. | | 1/1 |
| 8,645,529 B2 * | 2/2014 | Doddavula | | 709/224 |
| 8,694,682 B2 * | 4/2014 | Siegemund et al. | | 709/246 |
| 2001/0052034 A1 * | 12/2001 | Takimoto | | 709/332 |
| 2005/0183094 A1 * | 8/2005 | Hunt | | 719/315 |
| 2007/0209044 A1 * | 9/2007 | Honishi et al. | | 719/330 |
| 2008/0155100 A1 * | 6/2008 | Ahmed et al. | | 709/226 |
| 2008/0250434 A1 * | 10/2008 | Ho et al. | | 719/329 |
| 2009/0249283 A1 * | 10/2009 | Bourdon | | 717/104 |
| 2010/0023866 A1 * | 1/2010 | Peck et al. | | 715/735 |
| 2012/0089726 A1 * | 4/2012 | Doddavula | | 709/224 |
| 2012/0215640 A1 * | 8/2012 | Ramer et al. | | 705/14.55 |

* cited by examiner

*Primary Examiner* — Phallaka Kik
(74) *Attorney, Agent, or Firm* — Kenneth L. Sherman, Esq.; Michael Zarrabian, Esq.; Sherman & Zarrabian LLP

(57) ABSTRACT

An Infrastructure Description Language (IDL) includes Service Level Hints (SLHs) and Service Level Requirements (SLRs). The SLHs and SLRs are used to configure at least one hardware resource in a computing system having an intelligent configurator to broker a hardware configuration based on the SLHs and SLRs.

22 Claims, 7 Drawing Sheets

PROGRAMMABLE INTELLIGENT STORAGE ARCHITECTURE BASED ON APPLICATION AND BUSINESS REQUIREMENTS

CROSS REFERENCE TO RELATED APPLICATIONS

The present application claims the benefit of provisional application 61/532,040, PROGRAMMABLE INTELLIGENT STORAGE ARCHITECTURE BASED ON APPLICATION AND BUSINESS REQUIREMENTS, filed on Sep. 7, 2011, the contents of which are hereby incorporated by reference.

FIELD OF THE INVENTION

The present invention is generally related to the use of an infrastructure description language to provide instructions for a controller to direct the operation of configurable hardware components based on application characteristics and business requirements. More particularly, the present invention is directed to an approach for software developers and administrators to provide information for configurable hardware to adapt the performance, power, endurance, scalability, and cost of the hardware based either on static or dynamic considerations.

BACKGROUND OF THE INVENTION

Computing systems ranging from smart phones to enterprise servers face a contradicting design requirement between quantity and quality of service. In order to lower costs, manufacturers are forced to "artificially generalize" users and their application requirements while designing or fabricating hardware components and devices.

One potential solution is to reconfigure the components of a system (product) at the hardware level. However, conventionally, a single hardware configuration is set by an administrator and used for extended periods of time. For example, consider a large-scale data storage system. Data centers play a crucial role for human civilization today as they host many aspects of all of our lives. Applications that run on these data centers perform different types of input/output operations on data storage subsystems. For example, a large scale social networking site may perform nearly 120 million queries per second on its database. Data storage operations (data read or data updates) warrant maximum performance to save fractions of seconds of latency that could help the business retain its competitive edge. In most cases, each data storage operation would require a different configuration of the storage subsystem to get the maximum performance.

Administrators in data centers are normally forced to set a single configuration for their data center infrastructure (including storage systems, data processing elements such as CPU, and networking within the data center) in order to attempt to optimize energy cost, performance, and capacity. As one example, the hardware may be configured to optimize energy savings but at the sacrifice of performance capability. In practice a problem that arises is that configuration settings based on long-term use averages may not work well on shorter time scales for all the operations performed by the software at runtime.

There is no satisfactory solution in the prior art for dynamically configuring hardware. Hardware-only solutions can't solve the problem due to their limited knowledge about multiple applications that take part in a runtime at a given instant. As a result, in many situations a hardware configuration setting established by an administrator produces a sub-optimum result. Different infrastructure configurations are required in storage subsystems based on several unknowns at the runtime of the software such as type of operation (e.g.) read or write; granularity of access (e.g.) 4 bytes or 4 KB or 4 MB; type of access (e.g) random or sequential; type of storage media/system (e.g.) memory or SSD and so on. In addition to software requirements that require different optimal run-time configurations in a data center, business or policy requirements could mandate different data center configurations based on optimizations/priorities places on energy cost, performance, capacity and so on.

SUMMARY OF THE INVENTION

An Infrastructure Description Language (IDL) provides instructions for a master controller to broker a configuration of a configurable hardware infrastructure. The IDL includes Service Level Hints (SLHs) providing information on application characteristics that are likely to affect the optimal hardware configuration for the execution of the application. The IDL also includes Service Level Requirements (SLRs) to reflect hardware optimization criteria of a user or administrator. The master controller brokers a hardware configuration based on the SLHs and SLRs.

One embodiment of the present invention is a computer program product including an application and the service level hints for the application.

Another embodiment of the present invention is for a method of receiving SLHs and SLRs and using the SLHs and SLRs to determine a hardware configuration for an application.

Still yet another embodiment of the present invention is a computing system having a processor and a memory configured to monitor SLHs and SLRs and determine a hardware configuration for an application. In one implementation the computing system is implemented as a system on a chip. The computing system may also be implemented as an intelligent storage system for a server or a mobile device.

DETAILED DESCRIPTION

Figure 1:
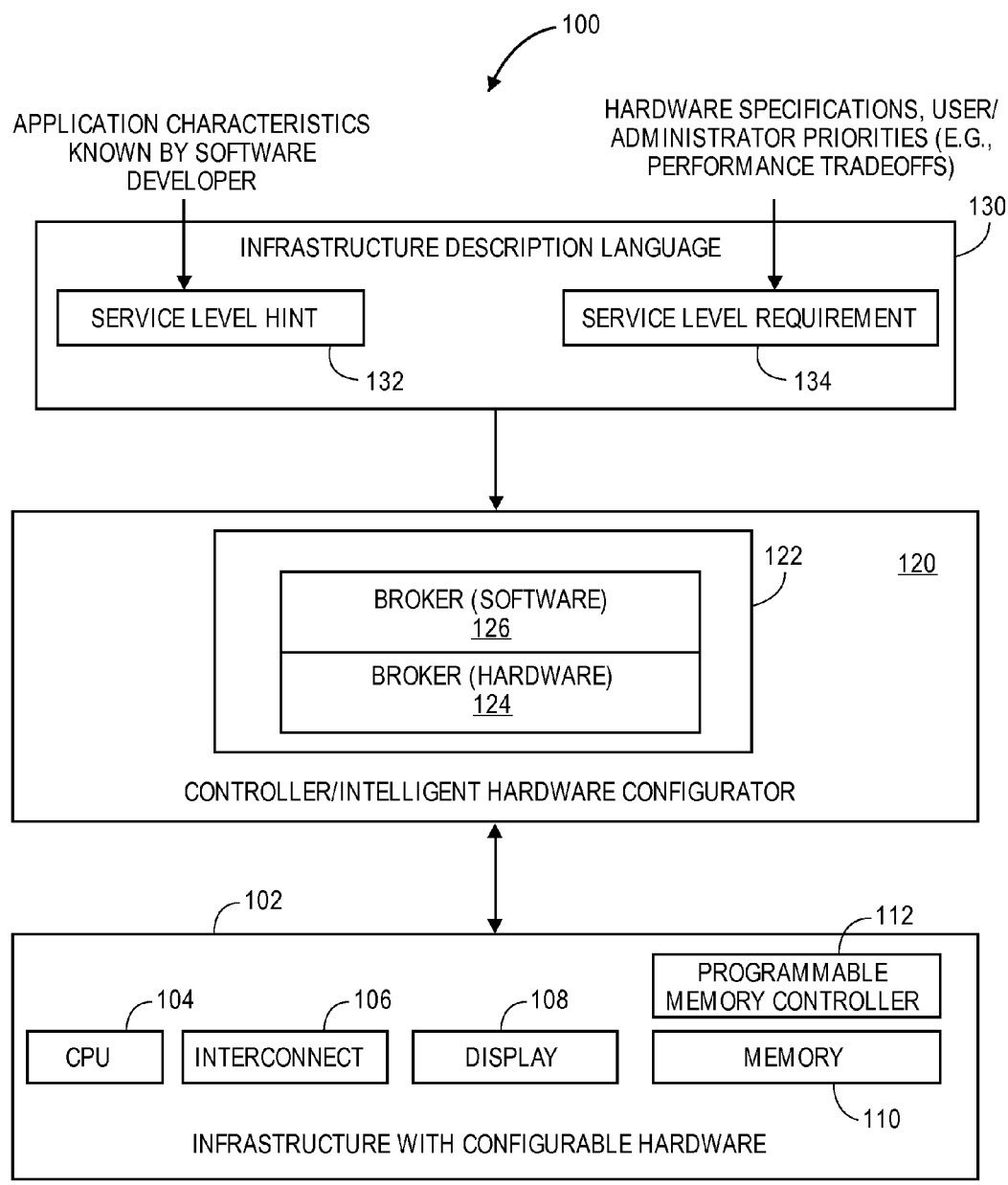
FIG. 1 illustrates a computing system utilizing an Infrastructure Description Language to configure hardware components in accordance with one embodiment of the present invention.

FIG. 1 illustrates a computing system 100 in accordance with one embodiment of the present invention. The computing system 100 includes a hardware infrastructure 102 with at least one configurable component. For example, the infrastructure may include a CPU 104, interconnect 106, display 108, and a memory 110 with a programmable memory controller 112. A master controller 120 includes a controller gateway layer (not shown) to communicate with target devices, such as a CPU 104, memory 110, interconnect 106, and display 108. The master controller 120 performs intelligent hardware configuration based on instructions from an Infrastructure Description Language (IDL) 130. The IDL permits Application Specific Brokering (ASB) in which the hardware infrastructure 102 may be intelligently configured based on application level profiles or dynamic access patterns.

Configurable hardware components permit tradeoffs such as: 1) performance, power, endurance, scalability, and cost. Thus, for example a CPU 104 may include settings to adjust parameters such as clock rates and/or voltages. A memory controller 1112 may be provided that has one or more configurable settings such as a configurable setting a scheduling or mapping. An interconnect 106 may have configurable interconnect settings, such as configurable settings for tradeoffs between power and bandwidth/speed. A display 108 may also have configurable hardware settings, such as between power and display performance.

IDL is a new language (or format) that includes service level hints (SLH) 132 and service level requirements (SLR) 134 to provide information that may be used to make decisions at runtime about how to optimize the hardware configuration. This includes:
1. Application code for the SLH that can hint at the execution infrastructure configuration based on the programmers understanding of application characteristics; and
2. Application code for the SLR as business/administrator requirements that can be used at run time to optimize based on requirements or weighted priorities including factors such as hardware specifications and user priority.

The SLHs 132 and SLRs 134 can be implemented as static or dynamic instructions. For the case of a static instruction, the SLH or SLR is set during execution of the application. In one implementation a static SLH instruction is stored as profile information. For example, a static SLH may be stored as profile information for an application. For a dynamic SLH the software developer may provide hints regarding how the developer understands the code will execute during specific phases or key times during program execution. A SLR would typically be implemented as a static instruction although more generally a SLR could be adjusted during program execution, such as dynamic administrator preferences (for example, a time-varying service level requirement regarding a tradeoff between performance and power).

Service Level Hints are provided in application software by the software architect/developer at development time. The focus of SLHs is on providing the hardware infrastructure 102 with the software developer's perspective on what the software will do at runtime. In one embodiment, SLHs are written as infrastructure-agnostic hints. To make it easier for software developers, the SLH is just a hint of an application characteristic likely to affect how the application will interact with the hardware infrastructure 102 and the programmer does not have to guarantee the validity of the hint. Developers writing software for high-performance enterprise code or mobile applications could use SLH throughout their code so that the runtime for the software is optimized appropriately. As another example, for software could provide SLH information before any data center operations on the storage or network are initiated.

As examples, the SLHs can provide a software developer's perspective on likely hardware infrastructure usage patterns for particularly time periods or until the next SLH. Illustrative examples of SLHs 132 include (but are not limited to):
1) 90% chances for Random 10 read in 4 KB sizes till next SLH is provided;
2) 100% chance of Large Sequential writes till end of execution OR next SLH;
3) Network will be used for small-chunk data transfers for the next 3 minutes; and
4) No network or I/O operation will take place till next SLH.

Service Level Requirements 134 are used to set a requirement for a tradeoff between performance, power, endurance, scalability, and cost. The SLR may be based on a user priority, such as that of the business or policy decision makers and administrators of a data center infrastructure. At the level of individual hardware elements, there are also tradeoffs at a finer level of granularity, such as tradeoffs in a programmable memory for random input/output (I/O) performance and sequential I/O performance. Thus, a SLR may correspond to a requirement to perform a specific optimization tradeoff, such as an optimization giving a specific weight (priority) to an optimization objective. Examples of SLR include (but not limited to):
1) Optimize with: 90% weight/priority for random I/O performance and 10% priority for energy; and
2) Optimize with: 50% weight/priority for sequential-I/O performance and 10% priority for endurance of the devices.

The master controller 120 may be implemented as a combination of software and hardware to perform a brokering function. This may include a broker module 122 including a hardware component 124 and a software component 126. That is, the master controller 120 receives the service level hints and service level requirements and then makes decisions on how to dynamically configure the hardware during runtime. In one implementation the controller 120 makes decisions based on fuzzy-logic based brokering. However, more generally, the broker module 122 may base decisions based on a set of rules to translate the instructions from the IDL into a hardware configuration consistent with the SLRs and SLHs in view of the actual hardware capabilities of the hardware infrastructure 102 and any feedback that the controller 120 receives from the hardware on the capabilities and status of the hardware infrastructure 102. In one implementation, a set of N different configurations for the hardware are pre-determined based on the hardware capabilities of the hardware infrastructure 102, where N is a positive number at least equal to two. In this implementation, the broker module 122 selects from among the N different pre-determined hardware configurations the one configuration that is the most consistent with the SLRs and SLHs in view of any feedback that the controller 120 receives from the hardware.

Figure 2:
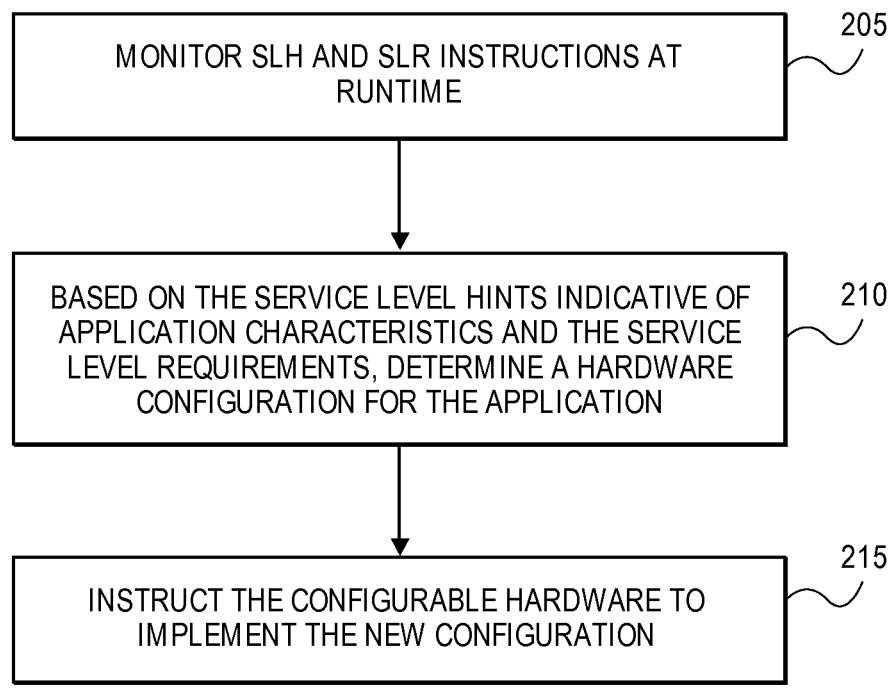
FIG. 2 is a high level flow chart of a method of using the Infrastructure Description Language in accordance with one embodiment of the present invention.

FIG. 2 is a high level process diagram in accordance with an embodiment of the invention. SLH and SLR instructions are monitored at runtime in step 205. A determination is made in step 210 of a hardware configuration for the application. The hardware is then instructed to implement the new configuration in step 215.

Figure 3:
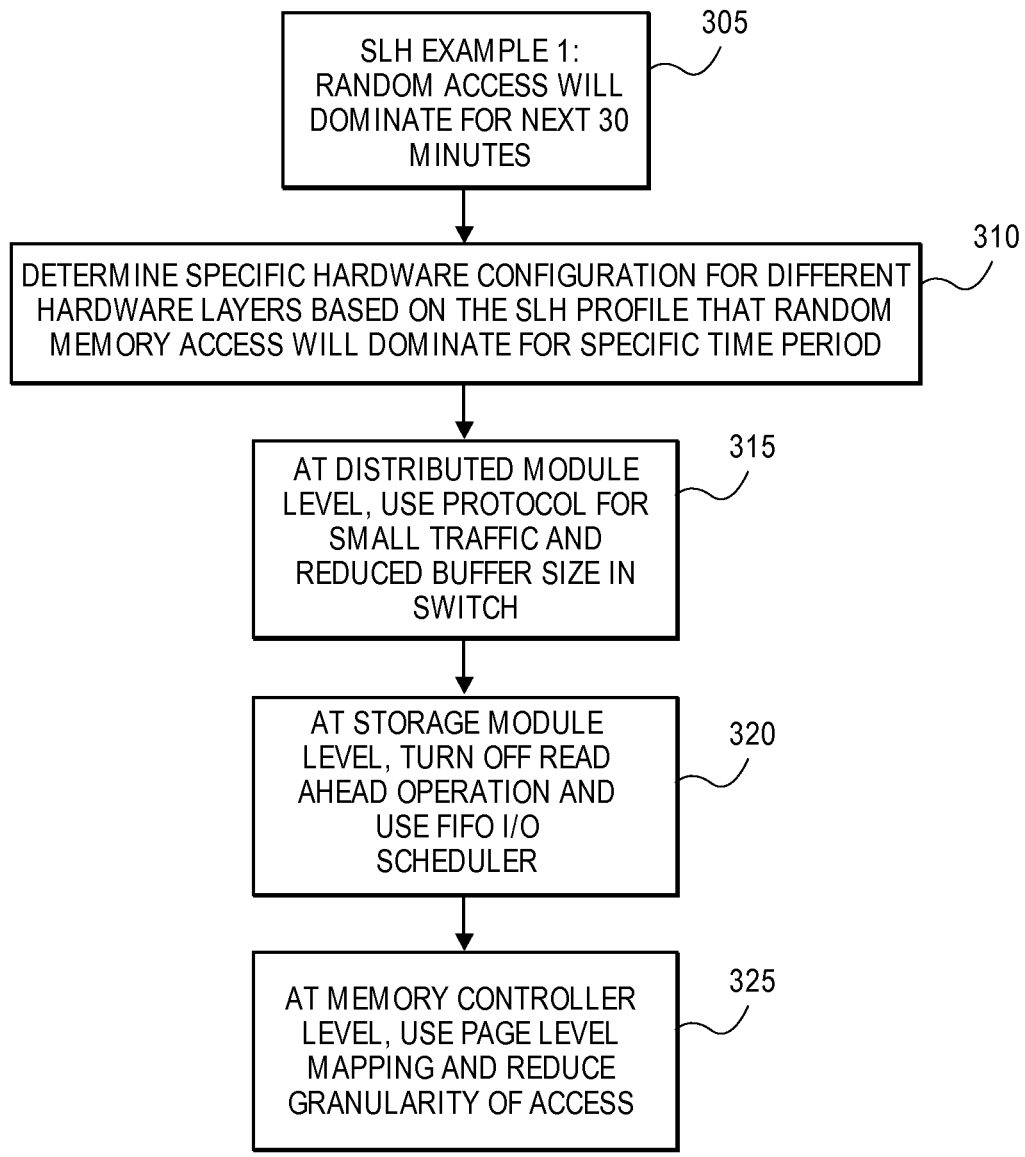
FIG. 3 is a flow diagram of an example of the use of the Infrastructure Description Language in accordance with one embodiment of the present invention.

FIG. 3 provides a first example of a SLH. In this example, the software developer has provided in step 305 a SLH that is hint that an application memory access pattern is one in which random access memory patterns are likely to dominate for 30 minutes of program execution. This hint is then used during runtime to make a determination in step 310 how to configure layers of the hardware to optimize the hardware for the likely access pattern. In this example, this includes at a distributed module level using a protocol for small traffic and a reduced buffer size in a switch in step 315, at a storage module level turning off a read head operation and using a FIFO I/O scheduler in step 320, and at a memory controller level using page level mapping and reducing granularity of access in step 325.

Figure 4:
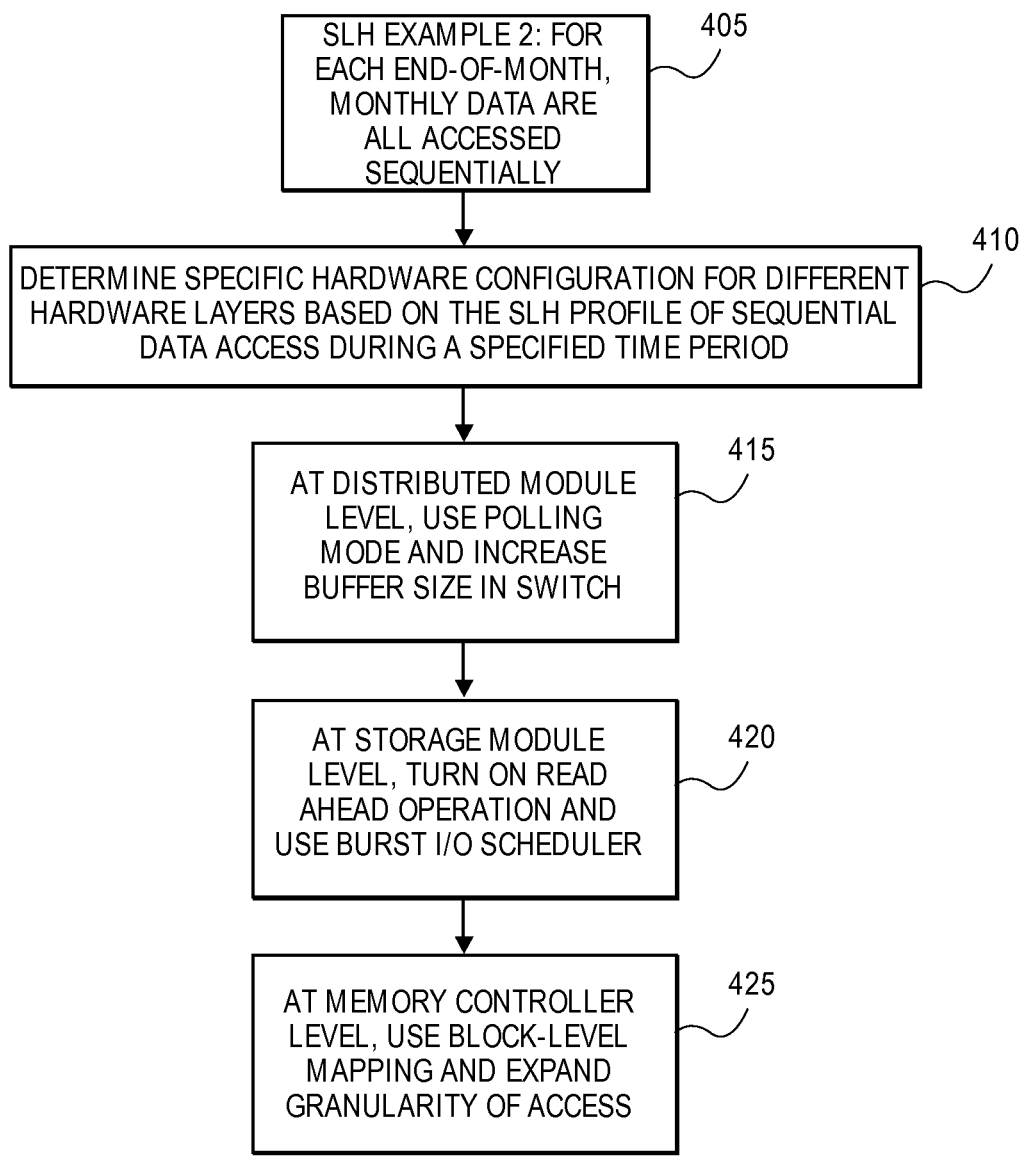
FIG. 4 is a flow diagram of an example of the use of the Infrastructure Description Language in accordance with one embodiment of the present invention.

FIG. 4 illustrates a second example of SLH. In this example, the programmer has provided step 405 a SLH that is a hint based on the programmers understanding that an access pattern for an end-of-month event in which data is likely to be access sequentially. As a result, in this example the SLH is converted into a specific hardware configuration in step 410 for the sequential access SLH. In this example, this includes in step 415 at a distributed module level using a polling mode and increasing buffer size in a switch; at a storage module level in step 420, turning on read ahead operations and using a burst I/O scheduler, and at a memory controller level using block-level mapping and expanding granularity of access in step 425.

Figure 5:
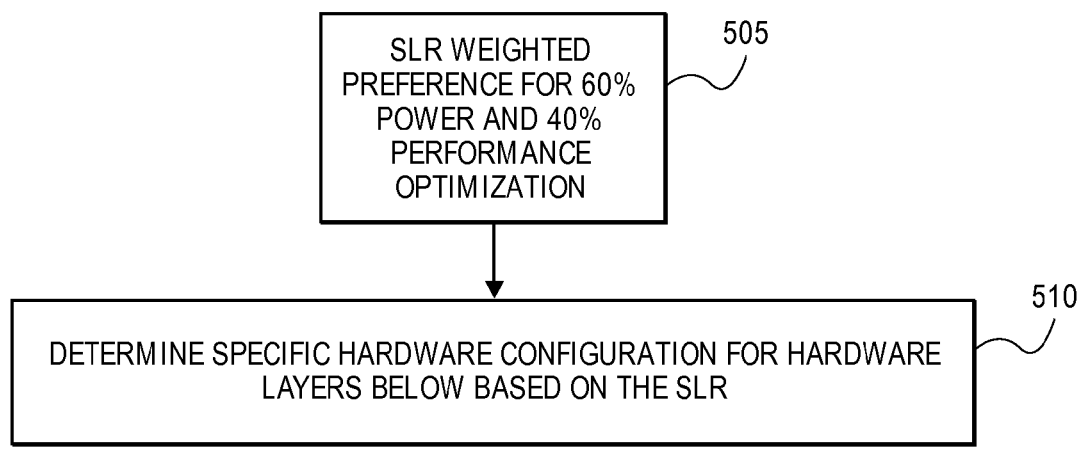
FIG. 5 is a flow diagram of an example of the use of the Infrastructure Description Language in accordance with one embodiment of the present invention.

FIG. 5 illustrates a first example of SLR. In this example, the SLR 505 is a user's weighted preference for 60% power and 40% performance optimization. This preference would then to determine a hardware configuration in step 510 to configure the hardware layers.

Since both SLRs and SLHs may be applicable at a given time, the hardware configuration that is selected may take into account the priority specified by the SLR and then within that constraint further consider additional optimizations based on the SLHs. In other words, the brokering function performed by the controller 120 may consider both SLRs and SLHs in determining a hardware configuration consistent with the SLR that also takes into account the SLHs.

The hardware-software brokering function provided by IDL 130 and the master controller 120 permits holistically-configuring an electronic product based on several runtime factors including but not limited to: 1) application access patterns, 2) user preferences, and 3) hardware profiles. Exemplary applications include mobile devices, storage systems, and system-on-a-chip implementations. Several device applications will now be described.

Exemplary Storage Architecture Examples

Figure 6:
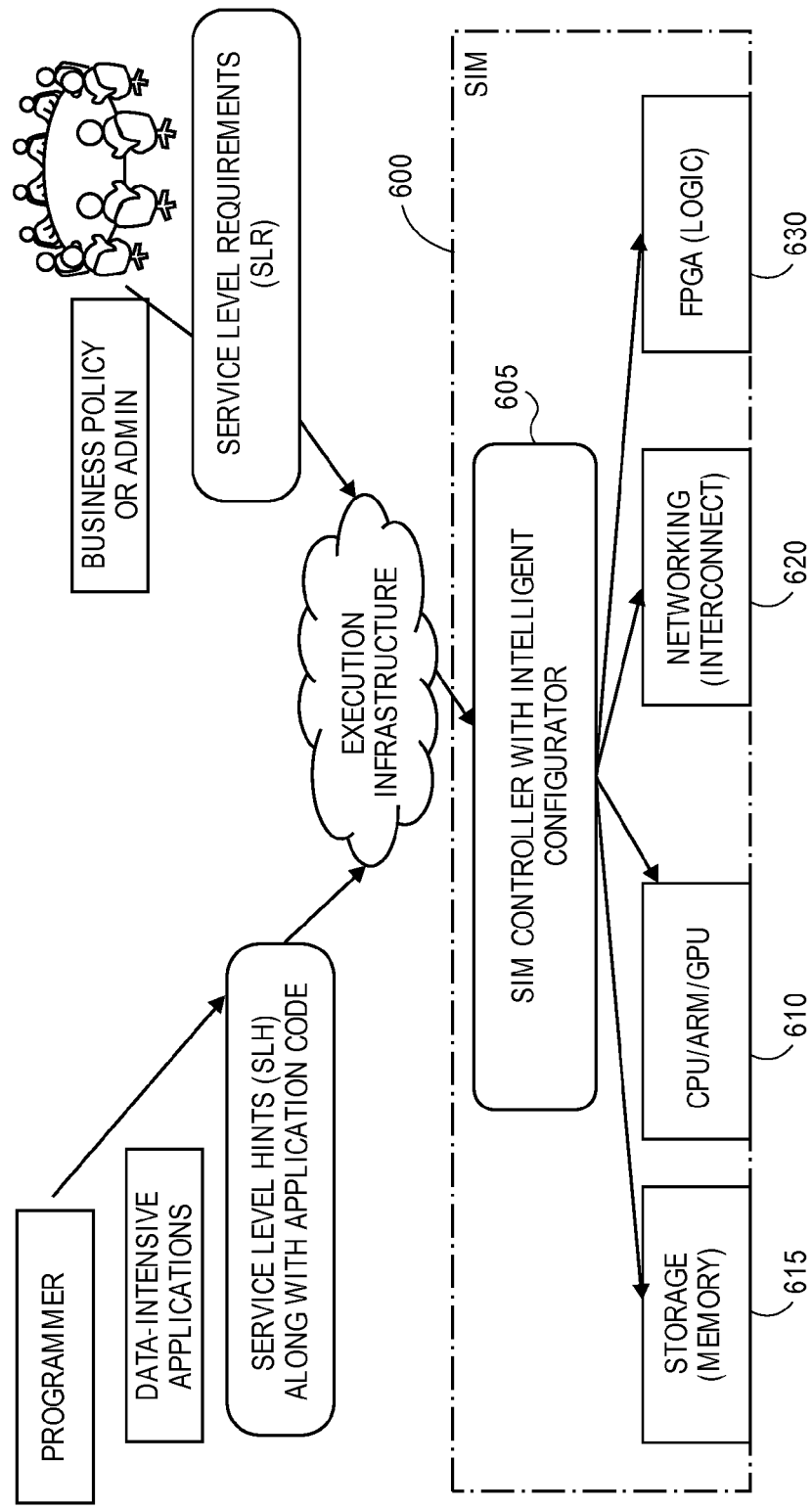
FIG. 6 illustrates an intelligent storage module for use in a system implementing the Infrastructure Description Language in accordance with one embodiment of the present invention.

FIG. 6 illustrates an exemplary embodiment of a Storage Infrastructure Module (SIM) 600 having a SIM controller 605 and intelligent configurator functioning as the controller/broker. The SIM 600 is a hardware module to produce all basic elements of computing in a single module. The SIM 600 contains all basic elements of computing infrastructure in a module. It includes:
1) At least one processor 610, such as a CPU, GPU, or ARM core process to perform computing operations;
2) A memory 615, such as memory in the form of a nonvolatile memory or a cryogenic memory;
3) An internal Interconnect, (not shown) such as in the form of silicon-photonic technology using optics or traditional wired;
4) An external network interface 620; and
5) Logic, such a an FPGA accelerator 630.

In this example the SIM controller 605 and intelligent configurator serves as the hardware broker. Additionally, the software portion of the broker may also be implemented on the SIM 6100. Thus, in this example, IDL is implemented on a computing system implemented as system on a chip (SOC) having all of the hardware and software components to implement IDL for an application and configure hardware (either on the SOC or coupled to the SOC) based on the instructions in the IDL.

Figure 7:
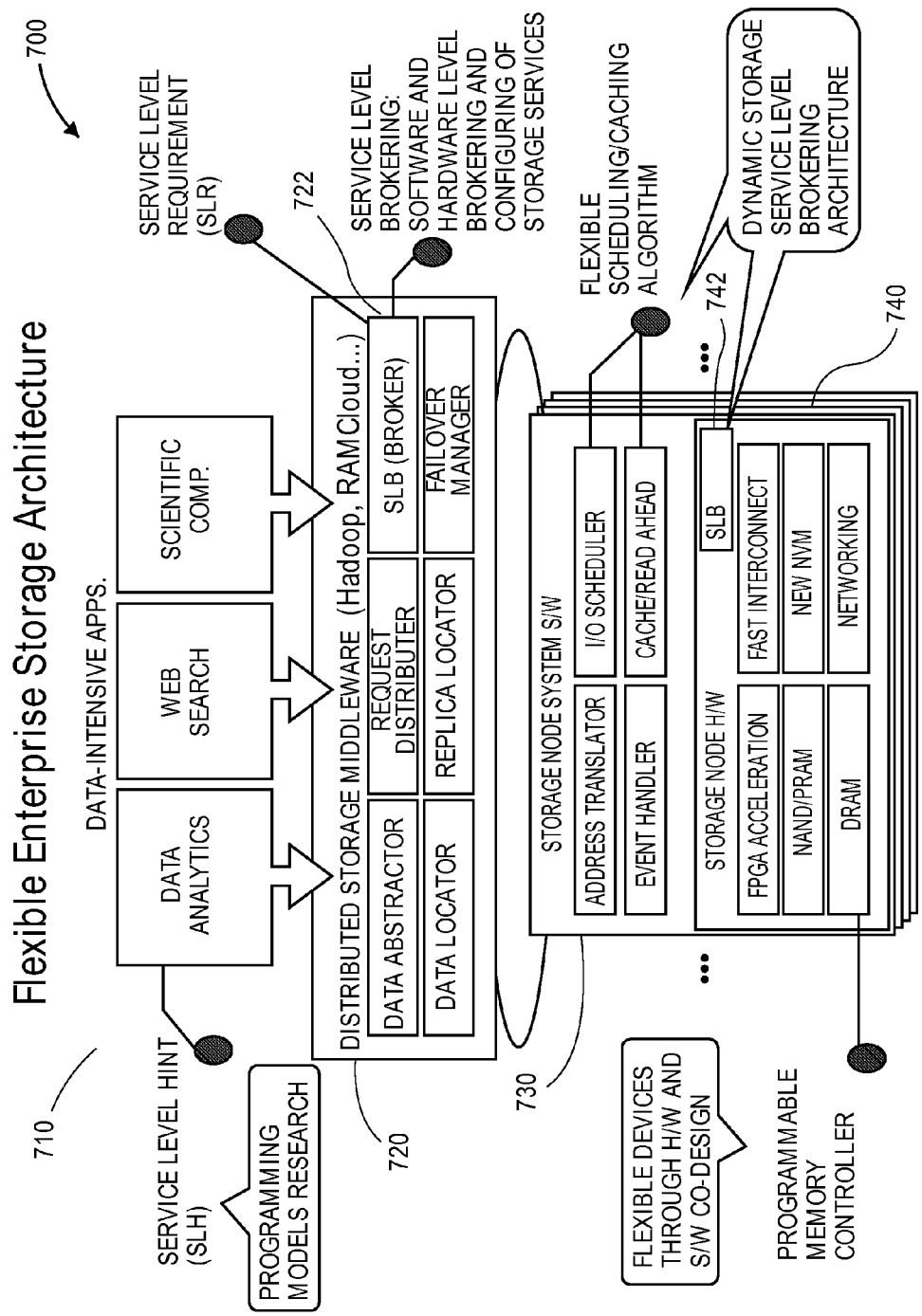
FIG. 7 illustrates an intelligent storage system executing the Infrastructure Description Language in accordance with one embodiment of the present invention.

FIG. 7 illustrates an exemplary flexible enterprise storage architecture 700 in accordance with one embodiment of the present invention. In this example, the data intensive applications 710 include data analytics applications that include service level hints. A distributed storage middleware 720 includes a broker module 722 to configure storage services. The distributed storage middleware may include other conventional middleware modules, such as a failover manager, request distributor, replica locator, data locator, and data abstraction. The broker module 722 may also receive service level requirements from an administrator.

A storage node subsystem 730 includes a storage node system unit having hardware and software, which may include conventional storage node system modules such as an address translator and event handler. Additionally, the I/O scheduler and cache read ahead modules may implement a flexible scheduling/caching algorithm. At the storage node level 740, a storage level broker module 742 is included to broker a configuration of a programmable memory controller and associated memory module units, such as a NAND/PRAM module and a non-volatile memory module.

Exemplary Mobile Device Example

An application of the present invention is for mobile electronic devices, such as smart phones. In a mobile device a programmable memory controller may be included to adjust memory settings. More generally, a mobile device has a CPU and a display which could also include configurable settings. Additionally, many mobile devices permit a variety of different applications to be executed on the mobile device.

In one embodiment, each mobile application could have a profile about itself that is used to store a SLH. For example, in an Android® smart phone, the manifest file (or any configuration file) for each application could have a profile that mentions that an application is a video application that will be memory-intensive with more throughput oriented access patterns in the memory. This profile-based service level hint information is a "Static SLH." Apart from Static SLH, applications in mobile device could also use dynamic SLH at runtime. (e.g.) the application could provide a hint that it is about to make a lot of CPU-memory data transfers.

Additionally, a mobile device could have information about hardware profiles of a specific "Infrastructure SLR (Service Level Requirements)." In one embodiment, this information would include any thing from manufacturer that does not usually change (after the mobile device is manufactured).

In a mobile device the broker is the hardware-software component that self configures the whole hardware system of the mobile device (phone) based on applications that take part in the run time. The broker utilize rules and weights to determine, based on the SLHs and SLRs, different possible configurations for memory, network operation and a display. As one example, a brokering solution could be used dynamically to pick the right configuration of DRAM controller to choose the memory scheduling algorithm at runtime for each application in a mobile device.

A prototype broker for a mobile device was simulated using MATLAB software as a set of fuzzy logic rules and membership functions and different use scenarios were simulated. Fuzzy logic is used in making decisions to choose optimal memory scheduling algorithm for each mobile application. The broker used fuzzy membership functions (for truth values) such as "MOST_LIKELY", "MORE_LIKELY", "LESS_LIKELY", etc., for each possible algorithm and gave a rating for each algorithm between 1 and 10. The optimal one had a largest number. The experiments proved the broker predicted 100% correct results for a test set data (with extreme scenarios) to predict the ratings for each memory scheduling algorithm with equal weights for performance and power (50%:50%). The memory scheduling algorithm selected by the broker, and memory address mapping were (manually) input into simulators with diverse types of workloads. Each workload has a different optimal address mapping. A total of 13 workloads were simulated for different scenarios. A fuzzy-logic based broker creates an application defined memory that configures memory parameters has the potential to boost power-performance savings on an average by 20% and up to 50% depending on the nature of the workload and the SLR. Using SLH alone, the simulation resulted in 16% and 19% savings on performance and energy respectively While the invention has been described in conjunction with specific embodiments, it will be understood that it is not intended to limit the invention to the described embodiments. On the contrary, it is intended to cover alternatives, modifications, and equivalents as may be included within the spirit and scope of the invention as defined by the appended claims. The present invention may be practiced without some or all of these specific details. In addition, well known features may not have been described in detail to avoid unnecessarily obscuring the invention.

In accordance with the present invention, the components, process steps, and/or data structures may be implemented using various types of operating systems, programming languages, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. The present invention may also be tangibly embodied as a set of computer instructions stored on a non-transitory computer readable medium, such as a memory device.

What is claimed is:

1. A method of using an electronic device having a processor, a memory, and at least one configurable hardware component, comprising:
    receiving instructions in an Infrastructure Description Language (IDL) indicative of at least one of: one or more Service Level Hints (SLHs) indicative of application characteristics of a software application affecting hardware requirements in a runtime environment, and one or more Service Level Requirements (SLRs) corresponding to specific requests for a hardware performance optimization in the runtime environment; and
    using the instructions at runtime of the application to obtain a hardware configuration consistent with at least one of the SLHs and the SLRs, and to dynamically configure at least one hardware infrastructure resource utilized by the application based on the hardware configuration.

2. The method of claim 1, wherein the SLHs include a static SLH associated with an operation of the application.

3. The method of claim 2, wherein the static SLH is stored as profile information for the application.

4. The method of claim 1, wherein the SLHs include a dynamic SLH associated with application characteristics of a segment of the application.

5. The method of claim 1, wherein the SLRs are statically selected for the electronic device.

6. The method of claim 1 wherein the SLRs are dynamically selected.

7. The method of claim 1 wherein using the instructions at runtime to obtain a hardware configuration consistent with at least one of the SLHs and the SLRs includes:
    brokering a hardware configuration for each configurable hardware infrastructure resource based on a combination of SLHs and SLRs by translating the instructions into a hardware configuration consistent with at least one of the SLHs and the SLRs.

8. A computing system having computer hardware and software, comprising:
    a master controller monitoring instructions for an application including one or more Service Level Hints (SLHs) indicative of characteristics of a software application affecting hardware requirements in a runtime environment, and one or more Service Level Requirements (SLRs) corresponding to specific requests for a hardware performance optimization in the runtime environment; and
    the master controller obtaining a hardware configuration consistent with at least one of the SLHs and the SLRs, and dynamically configuring at least one configurable hardware component utilized by the application based on the hardware configuration.

9. The computing system of claim 8, wherein the master controller includes fuzzy logic to choose hardware configurations based on the SLHs and the SLRs.

10. The computing system of claim 8, wherein the master controller resides on a system on a chip (SOC) including a processor and a memory controller.

11. The computing system of claim 8, wherein the master controller controls a memory configuration.

12. The computing system of claim 11, wherein the computing system is a smart phone.

13. The computing system of claim 12, wherein a SLH is statically provided as part of a profile in a configuration file for the application.

14. The computing system of claim 12, wherein the SLH is dynamically provided during runtime as part of the application.

15. The computing system of claim 12, wherein the SLR is statically set for the smart phone.

16. The computing system of claim 8, wherein the computing system is a storage system having a programmable memory controller, wherein the SLHs and the SLRs are used to configure the memory storage.

17. A method of configuring an electronic product based on one or more runtime factors, comprising:
    monitoring runtime of an application written in an Infrastructure Description Language (IDL) including instructions indicative of at least one of: one or more application characteristics likely to affect hardware requirements in a runtime environment, and one or more specific requests for a hardware performance optimization in the runtime environment;
    selecting hardware configurations for one or more hardware components based on the application characteristics and any specific request for particular hardware performance optimizations; and
    dynamically configuring the one or more hardware components based on the selected hardware configurations.

18. A computer program product including computer program code stored on a non-transitory computer readable medium which when executed on a processor implement a method comprising:
    receiving instructions in an Infrastructure Description Language (IDL) indicative of at least one of: one or more Service Level Hints (SLHs) indicative of application characteristics of a software application affecting hardware requirements in a runtime environment, and one or more Service Level Requirements (SLRs) corresponding to specific requests for a hardware performance optimization in the runtime environment; and using the instructions at runtime of the application to obtain a hardware configuration consistent with at least one of the SLHs and the SLRs, and to dynamically configure at least one hardware infrastructure resource utilized by the application based on the hardware configuration.

19. The computer program product of claim 18, wherein the SLHs include a static SLH associated with an operation of the application.

20. The computer program product of claim 19, wherein the static SLH is stored as profile information for the application.

21. A computer program product comprising computer program code stored on a non-transitory computer readable medium including:
   computer code for a software application;
   computer code including at least one service level hint representing characteristics of the software application relevant to dynamically configuring a configurable hardware infrastructure during runtime of the application; and
   computer code for obtaining a hardware configuration consistent with the at least one service level hint, and dynamically configuring at least one hardware infrastructure utilized by the application based on the hardware configuration.

22. The computer program product of claim 21, wherein the service level hint represents a software developer's understanding of application characteristics during at least a segment of application execution likely to affect at least memory access behavior.

\* \* \* \* \*